(12) United States Patent
Cerisier et al.

(10) Patent No.: US 7,586,996 B2
(45) Date of Patent: Sep. 8, 2009

(54) METHOD FOR CONTROLLING THE POWER OF THE OUTPUT SIGNAL FROM AN AMPLIFIER SYSTEM AND THE ASSOCIATED SYSTEM

(75) Inventors: Patrick Cerisier, Copponex (FR); Patrice Musy, Geneva (CH)

(73) Assignee: STMicroelectronics, N.V., Amsterdam (NL)

(*) Notice: Subject to any disclaimer, the term of this patent is extended or adjusted under 35 U.S.C. 154(b) by 708 days.

(21) Appl. No.: 11/088,616

(22) Filed: Mar. 24, 2005

(65) Prior Publication Data

US 2005/0226347 A1    Oct. 13, 2005

(30) Foreign Application Priority Data

Apr. 8, 2004    (EP)    ................... 04290939

(51) Int. Cl.
*H04K 1/02* (2006.01)
*H04B 3/46* (2006.01)
*H04B 1/10* (2006.01)

(52) U.S. Cl. .............. 375/297; 375/227; 375/296; 375/350

(58) Field of Classification Search ............. 375/297, 375/227, 296, 350
See application file for complete search history.

(56) References Cited

U.S. PATENT DOCUMENTS

| | | | | |
|---|---|---|---|---|
| 5,196,806 | A | * | 3/1993 | Ichihara ............... 330/137 |
| 5,606,285 | A | * | 2/1997 | Wang et al. ............ 330/134 |
| 5,650,954 | A | * | 7/1997 | Minuhin ............... 708/819 |
| 5,732,334 | A | | 3/1998 | Miyake ................. 455/126 |
| 5,923,712 | A | * | 7/1999 | Leyendecker et al. .... 375/297 |
| 6,240,144 | B1 | * | 5/2001 | Ha ....................... 375/297 |

(Continued)

FOREIGN PATENT DOCUMENTS

DE    10100151    7/2002

(Continued)

OTHER PUBLICATIONS

Bajers, Fredrik, "The Symmetric Rudin-Sapiro Trasnform- An easy, stable, and fast construction of multiple orthogonal spread spectrum signals", 2003, Proceedings of the 3rd International Symposium on Image and Signal Processing and Analysis.*

(Continued)

*Primary Examiner*—David C Payne
*Assistant Examiner*—Sarah Hassan
(74) *Attorney, Agent, or Firm*—Lisa K. Jorgenson; Allen, Dyer, Doppelt, Milbrath & Gilchrist, P.A.

(57) ABSTRACT

Filtered digital information representative of the power of an output signal from an amplifier is generated, and control information from a setpoint representative of a desired power for the output signal is generated from the desired response time for the establishment of the power and from a model to be followed for the establishment. In addition, a gain control and a bias current control are established for each initial variable-gain amplifier from the filtered digital information, from the control information and from a polynomial digital regulation of the RST type whose polynomial coefficients are determined from input parameters comprising characteristics of each variable-gain amplifier and from characteristics of the filter generating the filtered digital information.

22 Claims, 5 Drawing Sheets

U.S. PATENT DOCUMENTS

| | | | |
|---|---|---|---|
| 6,345,177 B1 * | 2/2002 | Renard et al. | 455/313 |
| 6,356,745 B1 * | 3/2002 | Lee et al. | 455/232.1 |
| 6,370,187 B1 * | 4/2002 | Agah | 375/219 |
| 6,591,090 B1 * | 7/2003 | Vuorio et al. | 455/126 |
| 6,768,795 B2 * | 7/2004 | Feltstrom et al. | 379/391 |
| 2002/0042256 A1 * | 4/2002 | Baldwin et al. | 455/232.1 |
| 2002/0044018 A1 * | 4/2002 | Dupuis et al. | 330/254 |
| 2002/0061073 A1 * | 5/2002 | Huang et al. | 375/295 |
| 2002/0081986 A1 * | 6/2002 | Yokoyama | 455/234.1 |
| 2002/0084844 A1 * | 7/2002 | Monroe | 330/51 |
| 2002/0097085 A1 * | 7/2002 | Stapleton | 330/10 |
| 2002/0146993 A1 * | 10/2002 | Persico et al. | 455/126 |
| 2002/0154708 A1 * | 10/2002 | Rouphael | 375/297 |
| 2004/0048592 A1 * | 3/2004 | Yamanaka | 455/234.1 |

FOREIGN PATENT DOCUMENTS

| | | |
|---|---|---|
| EP | 0813294 | 12/1997 |
| EP | 0889583 | 1/1999 |
| WO | WO03/056698 A2 * | 7/2003 |

OTHER PUBLICATIONS la Cour-Harbo, Anders. "The Symmetric Rudin-Shapiro Transform- An Easy, Stable, and Fast Construction of Multiple Orthogonal Spread Spectrum Signals" 2003. IEEE. Proceedings of the 3rd International Symposium on Image and Signal Processing and Analysis. pp. 262-265.*

* cited by examiner

METHOD FOR CONTROLLING THE POWER OF THE OUTPUT SIGNAL FROM AN AMPLIFIER SYSTEM AND THE ASSOCIATED SYSTEM

FIELD OF THE INVENTION

The invention relates to amplifier devices, and in general, to the power control of an output signal from an amplifier device. The invention can be advantageously applied, but is not limited to, radio frequency transmission architectures of wireless communications systems, especially CDMA or W-CDMA systems, for controlling the output power at the antenna connector.

BACKGROUND OF THE INVENTION

CDMA (Code Division Multiple Access) systems allow multiple users to share a common frequency and a common time channel by using encoded modulation. Some CDMA systems that could be mentioned are CDMA 2000, W-CDMA (Wide Band CDMA) and the IS-95 standard.

Within CDMA systems, those that use separate frequencies for the transmission and the reception (CDMA-FDD system), and those that use a common frequency for the transmission and the reception, but separate time domains for the transmission and the reception (CDMA-TDD system), may be further distinguished.

As opposed to communication systems having a constant envelope modulation, such as the GSM system, CDMA systems use a modulated signal that has a modulation with a varying envelope. In other words, such a signal is both phase and amplitude modulated, and the amplitude of the modulation is not constant.

In remote terminals, such as cellular mobile telephones, the transmission power amplifier stage should have a wide range of radio frequency power operations. Also, notably in CDMA-FDD systems, the power amplifier is in continuous operation during communications.

More precisely, the transmission power delivered by the power amplifier can vary over a predetermined power range, typically from −50 dBm to 24 dBm in steps of 1 dB for third generation mobile telephones. The transmission power is adjusted, over this power range, as a function of power information received periodically by the telephone and which comes from the base station.

Furthermore, each time there is a request to modify the transmission power by a base station, this modification should be carried out within a short time, typically 50 μs. To verify the transmission power, this should be detected at the output of the system, and when the signal has a varying envelope the detector output signal exhibits ripple that can be very significant and be situated in a frequency range from 0 to 4 MHz in W-CDMA systems. It is then necessary to filter this output signal. However, this filtering process requires a very long time constant which is incompatible with the time for establishing the requested transmission power.

SUMMARY OF THE INVENTION

In view of the foregoing background, an object of the invention is control the output power of an amplifier circuit, especially when the output signal is, after detection, affected by ripple, as in the case of modulated signals with a varying envelope.

The transmission power of a remote terminal, such as a cellular mobile telephone, in particular, is controlled by filtering a signal that is representative of the output power, without there being any incompatibility between the filtering time and the time for establishing a new requested transmission power.

One aspect of the invention is directed to a method for regulating the power of the output signal of a system comprising at least one initial variable-gain amplifier receiving an incident signal. Filtered digital information that is representative of the power of the output signal is generated. Control information is generated from a setpoint that is representative of a desired power for the output signal, and from a model to be followed having a desired transfer function for establishing the power in a desired response time. In addition, a gain control and a bias current control are established for each initial variable-gain amplifier. The respective controls are based upon the filtered digital information, from the control information and from a polynomial digital regulation of the RST type. The polynomial coefficients of the polynomial digital regulation are determined from input parameters comprising characteristics of each variable-gain amplifier and from characteristics of the filter generating the filtered digital information.

Advantageously, the incident signal is a modulated signal with a modulation having a varying envelope. By performing a pre-filtering process, the RST regulation allows the time constant of the detection filter to be decorrelated from the time (for example, 50 μs) for establishing the requested power.

In a preferred embodiment, when the system also comprises a variable-gain output amplifier connected at the output of the last initial variable-gain amplifier, a gain control and a bias current control for the variable-gain output amplifier may also be established from the setpoint and without passing through the polynomial digital regulation of the RST type.

Advantageously, when the system comprises at least one frequency transposition means, a bias current control, and where required, a gain control is also established for each frequency transposition means. The model to be followed is, for example, a filter having a chosen transfer function.

In a preferred embodiment, the input parameters may comprise the response times and the orders of the transfer functions for each variable-gain amplifier, the time constant of the filter generating the filtered digital information and a frequency band to be rejected. The gain control and the bias current control of each initial variable-gain amplifier are established from an output signal value of the polynomial digital regulation of the RST type and from at least one correspondence table.

Another aspect of the invention is directed to an amplifying system with power regulation of the output signal, comprising at least one initial variable-gain amplifier and receiving an incident signal. The system may comprise first generation means for generating filtered digital information that is representative of the power of the output signal, and a model receiving a setpoint that is representative of a desired power for the output signal. The model may have a desired transfer function for establishing the power in a desired response time, and delivering control information. Control means may comprise a polynomial digital regulator of the RST type.

The control means are capable of establishing a gain control and a bias current control for each initial variable-gain amplifier, from the filtered digital information and from the control information. The polynomial coefficients of the regulator depending on input parameters may comprise characteristics of each variable-gain amplifier and on characteristics of the filter of the first generation means. The incident signal may be a modulated signal with a variable-envelope modulation.

In a preferred embodiment, the polynomial digital regulator of the RST type comprises three digital filters with finite pulse response. One filter R may receive the filtered digital information, one filter T may receive the control information and the other filter 1/S delivers an output signal.

In one advantageous embodiment, the system may additionally comprise a variable-gain output amplifier connected at the output of the last initial variable-gain amplifier, a switch-mode power supply and a digital-to-analog converter that are capable of establishing a gain control and a bias current control for the variable-gain output amplifier from the setpoint without passing through the polynomial digital regulator of the RST type.

The first generation means may comprise, for example, means for sampling an image of the output electrical voltage of the system, a filter (DET) connected downstream of the sampling means, and analog-to-digital conversion means (A/D) connected downstream of the filter and delivering the filtered digital information.

Advantageously, the system may also comprise at least one frequency transposition means. The control means is capable of establishing a bias current control, and where required, a gain control for each frequency transposition means. Furthermore, the control means may comprise at least one correspondence table for determining the gain controls and the bias current controls from the output signal of the polynomial digital regulator of the RST type.

Yet another aspect of the invention is directed to a wireless communications element, for example, a cellular mobile telephone, comprising a transmission circuit incorporating an amplifying system as described above.

BRIEF DESCRIPTION OF THE DRAWINGS

Other advantages and characteristics of the invention will become apparent upon examining the detailed description of non-limiting embodiments and of the appended drawings, in which.

DETAILED DESCRIPTION OF THE PREFERRED EMBODIMENTS

Figure 1:
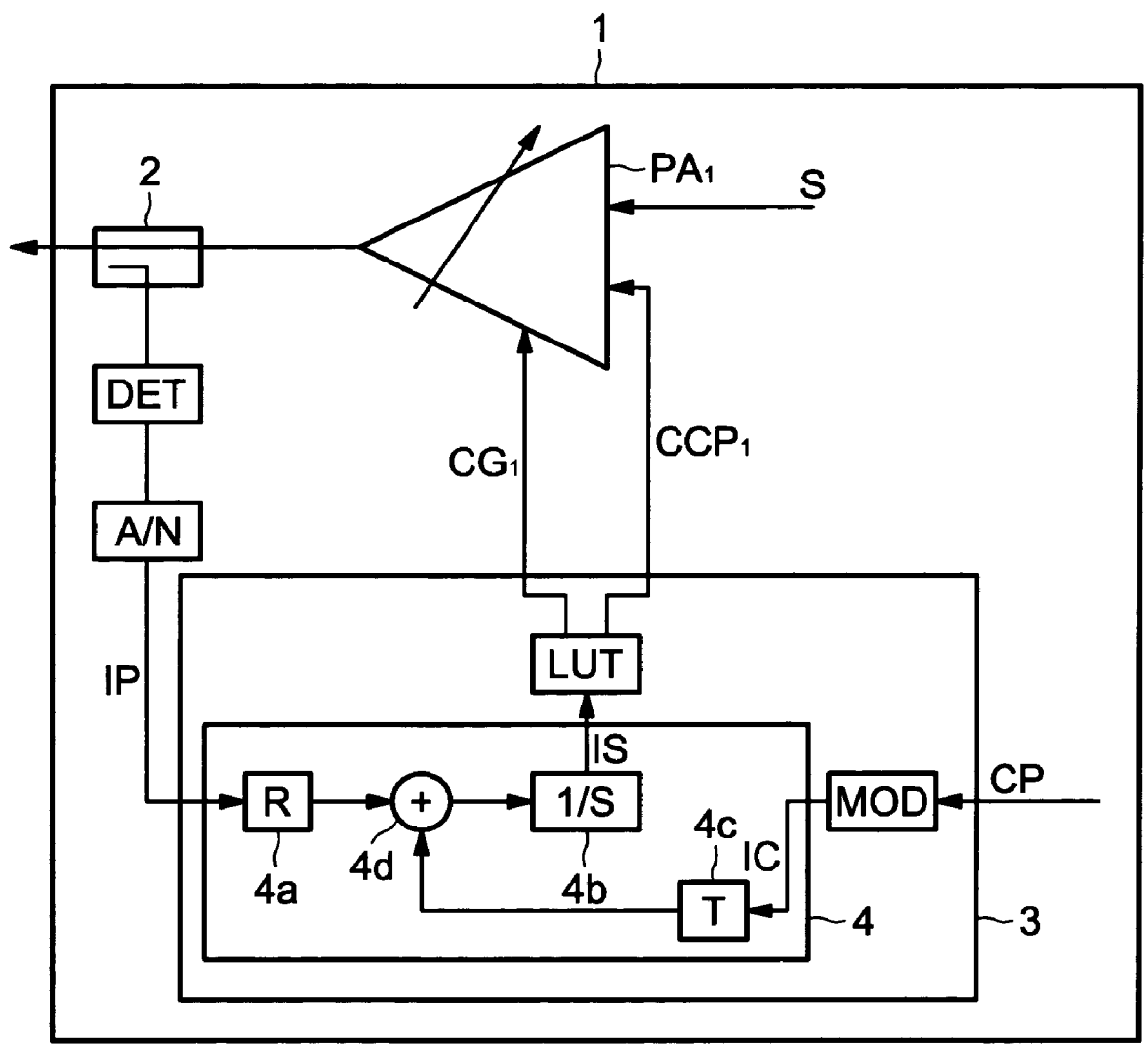
FIG. 1 illustrates an embodiment of an amplifier system in accordance with the invention.

FIG. 1 shows a system 1 comprising a variable-gain amplifier $PA_1$ receiving an incident signal S at its input. At the output of the variable-gain amplifier $PA_1$, a sampling element 2, such as a directional coupler, allows a signal that is representative of the output power of the variable-gain amplifier $PA_1$ to be sampled.

Figure 2:
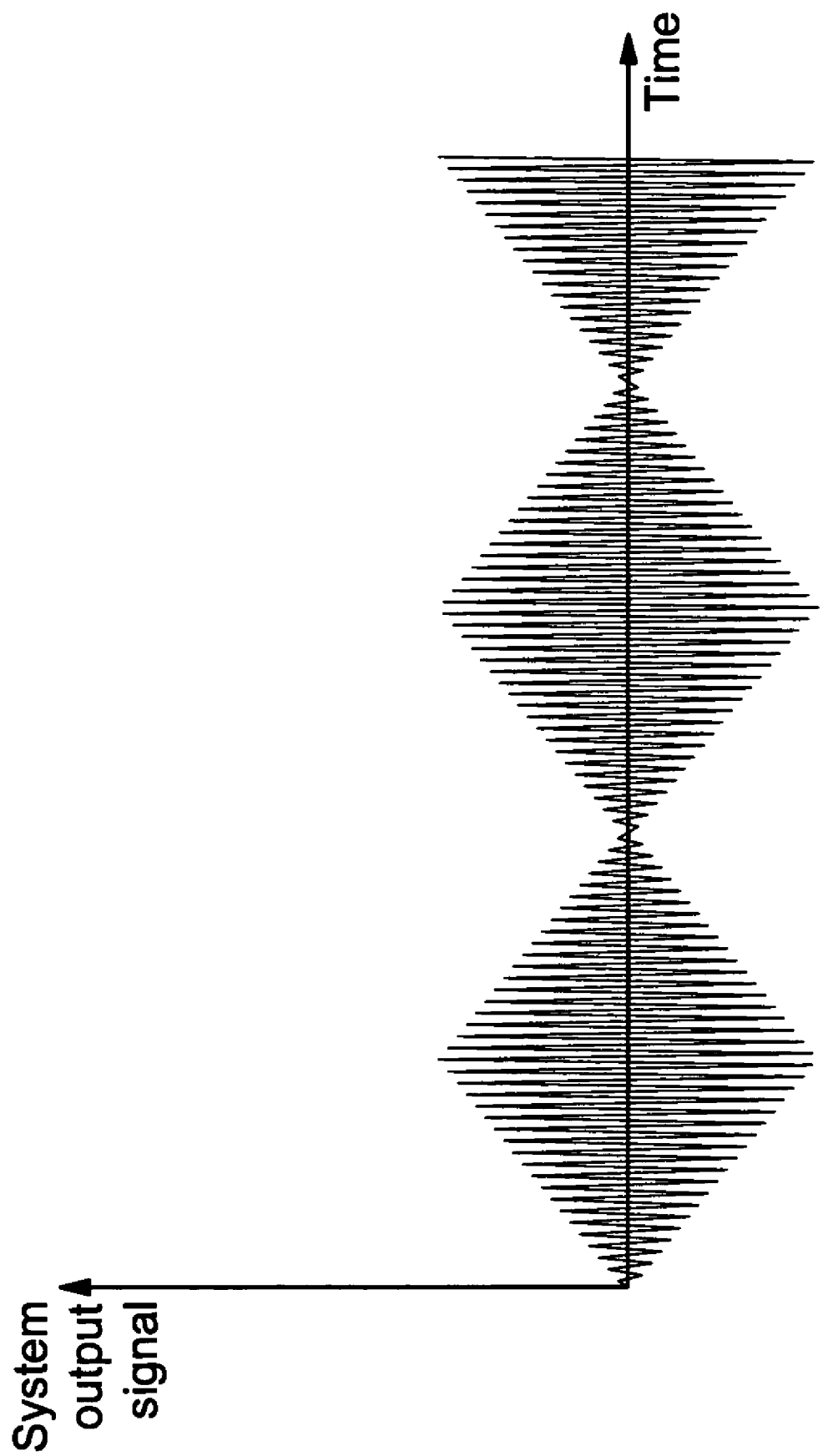
FIG. 2 illustrates a signal modulated with a variable-envelope modulation in accordance with the invention.

The representative signal is an image of the output electrical voltage of the system 1. For example, the output electrical voltage of the variable-gain amplifier $PA_1$, reduced by twenty decibels, is sampled with a known impedance of the sampling element, which allows the corresponding power to be determined. Since the voltage sampled is reduced by twenty decibels, it is one hundred times smaller than the output voltage. This allows the output signal of the variable-gain amplifier $PA_1$ to remain unaltered. The sampled signal has a waveform shown in FIG. 2 when it comes from an incident signal that is phase and amplitude modulated (variable-envelope modulation).

Figure 3:
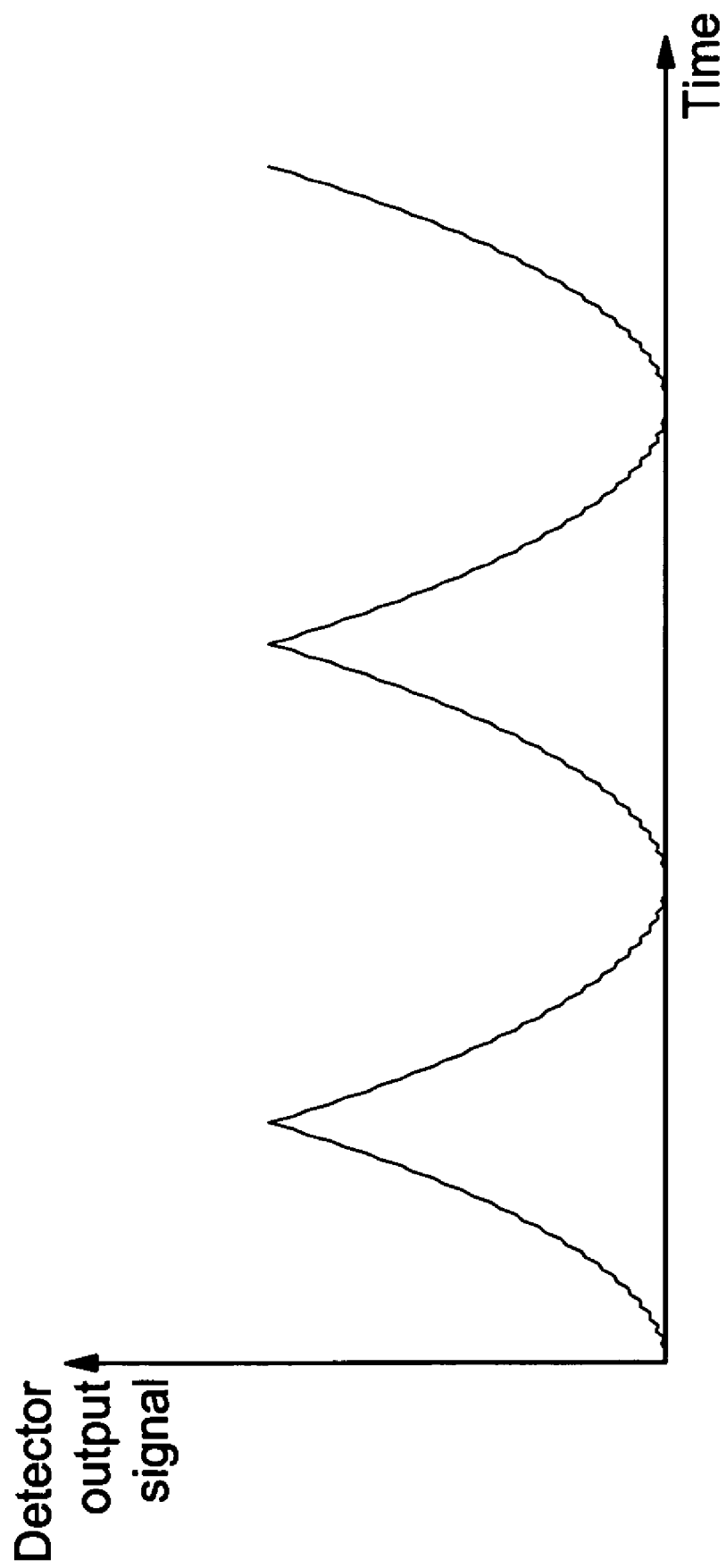
FIG. 3 illustrates filtered digital information that is representative of the output signal in accordance with the invention.

The sampled signal arrives at the input of a filter DET that delivers as output the envelope, or the envelope raised to the power two of the sampled signal, as shown in FIG. 3. In the example, the filter DET delivers the envelope of the sampled signal raised to the power two, as shown in FIG. 3. The filter DET only recovers the square of the envelope of the sampled signal with a limited precision, since small oscillations due to the original signal remain. The elimination of these oscillations normally requires additional filtering with a long time constant, which may turn out to be incompatible with certain applications, such as W-CDMA applications, where the time for establishment of the requested output power is short.

The invention addresses this problem of incompatibility by de-correlating, and in particular, using a digital regulation of the RST type, the filtering time required by the output signal of the filter DET and the maximum time for establishing a new output power for the variable-gain amplifier $PA_1$.

More precisely, the output signal of the filter DET is digitized by an analog-to-digital converter A/D. Digital information IP that is representative of the output power of the variable-gain amplifier $PA_1$ is then obtained. This digital information IP is delivered to the input of a polynomial digital regulator of the RST type 4 incorporated into a control module 3. The regulator 4 also receives at its input a digital setpoint CP that is representative of the desired power of the output signal of the variable-gain amplification stage $PA_1$. The control module 3 additionally comprises a model MOD which is, for example, a filter having a desired predetermined transfer function corresponding to a desired change for the establishment of the new power, and a time constant corresponding to the desired time for establishing the power (for example, 50 µs).

A regulator of the RST type is known to those skilled in the art and is described notably in chapter 10 of the book entitled "Digital Control of Dynamic Systems" by Roland Longchamps, published by "Presses Polytechniques et Universitaires Romandes". The main features thereof will be recalled below.

The regulator of the RST type comprises three digital filters with finite pulse responses 4a, 4b, 4c having respective transfer functions R, 1/S and T. The coefficients of the polynomials R, S, T of the transfer functions of these digital filters are determined by a synthesizing algorithm RST such that, in a closed-loop operation, the regulator has the transfer function of the model MOD.

The determination of the polynomial coefficients also uses input parameters comprising characteristics of the variable-gain amplifier $PA_1$, and characteristics of the filter DET for generating the filtered digital information IP. These characteristics comprise the response time and the order of the transfer function of the variable-gain amplifier $PA_1$, the time constant of the filter DET and a frequency band to be rejected. The frequency band to be rejected corresponds to the ripple of the signal at the output of the detector.

The digital setpoint CP is filtered by the model MOD, and the result of this filtering operation is the control information IC which is delivered to the input of the filter 4c (filter T).

The polynomial regulator of the RST type 4 also comprises an adder module 4d summing the outputs of the filters 4a (filter R) and 4c (filter T) in order to deliver the sum to the filter 4b (filter 1/S).

At the output of the filter 4b (filter 1/S), a digital output signal IS is used by a correspondence table LUT which, from this output signal IS, makes a gain control $CG_1$ and a bias current control $CCP_1$ correspond to the variable-gain amplifier $PA_1$. This correspondence table takes the characteristics of the variable-gain amplifier $PA_1$ into account.

Figure 4:
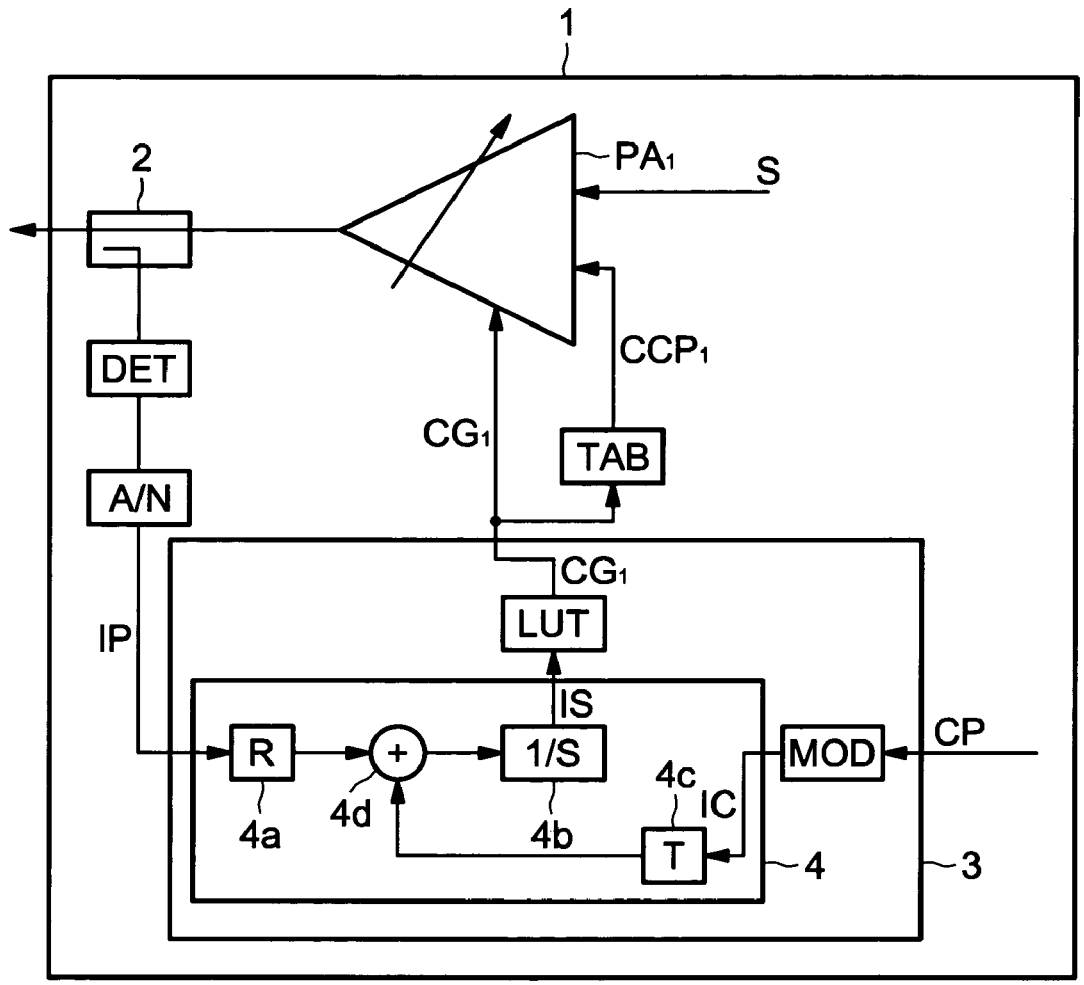
FIG. 4 illustrates another embodiment of an amplifier system in accordance with the invention.

FIG. 4 shows a variation of the system shown in FIG. 1, in which the correspondence table LUT only delivers a gain control $CG_1$ and, from this gain control $CG_1$, another correspondence table TAB delivers a bias current control $CCP_1$ to the variable-gain amplifier $PA_1$.

Figure 5:
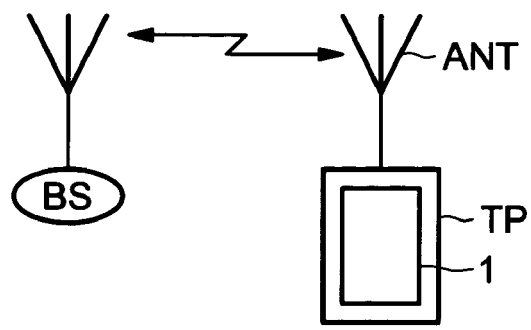
FIGS. 5 and 6 illustrate an application of the invention to a cellular mobile telephone.

In FIG. 5, a system 1 according to the invention is shown that is incorporated into the transmission circuit of a cellular mobile telephone TP, operating according to the W-CDMA standard. The invention is not, of course, limited to this particular application.

The telephone communicates with a base station BS via an antenna ANT. The system 1 allows the power of the transmission signal of the cellular mobile telephone TP to be adapted as a function of the transmission power which itself is requested by the base station BS. The frequency of this change in transmission power is, for example, on the order of 1,500 times per second.

For a transmission power change frequency of 1,500 times per second, the transmission power should be modified about every 667 microseconds, and in this case, the standard imposes a time to reach the new transmission power requested. For example, for the 3GPP standard, the time for establishing a new transmission power is 50 microseconds. As explained above, the shape of the curve and the time for this establishment determine the model MOD, for example, in the form of a filter with a chosen transfer function and a chosen time constant.

Figure 6:
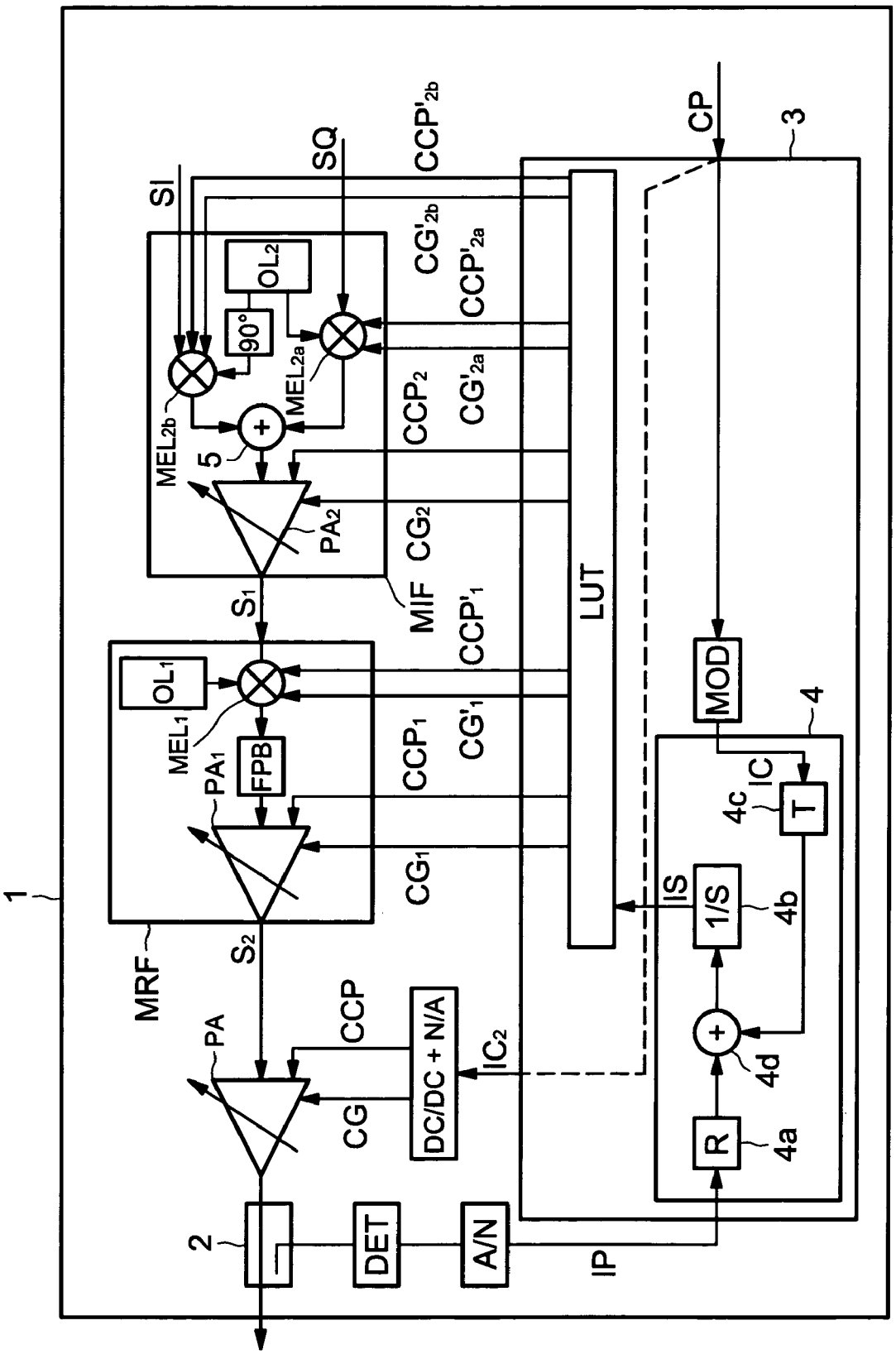

The architecture of the transmission circuit of the telephone incorporating a system 1 according to the invention is illustrated in more detail in FIG. 6. The transmission circuit has a superheterodyne architecture with a variable-gain amplifying first stage MIF at an intermediate frequency, for example 500 MHz, followed by a variable-gain amplifying second stage MRF at an RF frequency (radio frequency), for example 2.6 GHz.

The MIF stage conventionally comprises two mixers $MEL_{2b}$ and $MEL_{2a}$ respectively receiving two base-band signals SI and SQ mutually phase shifted by 90°, and emanating from the base-band process of the telephone. These two mixers transpose the signals SI and SQ to the intermediate frequency from two transposition signals produced by a local oscillator $OL_2$.

The sum (adder 5) of the two transposed signals is amplified in a variable-gain amplifier $PA_2$. This stage MIF allows a gain control of 60 dB, for example.

The signal $S_1$ produced by the stage MIF is transposed into the radio frequency domain by a mixer $MEL_1$ receiving another transposition signal produced by a local oscillator $OL_1$. After filtering in a bandpass filter FPB, the signal is amplified in a variable-gain amplifier $PA_1$. This stage MIF allows a gain control of 30 dB, for example.

The signal $S_2$ produced by the stage MRF is then amplified in an output amplifier PA. From the output control signal of the regulator 4 of the RST type, the correspondence table LUT makes a gain control and/or a bias current control correspond for each variable-gain amplification stage PA1 and PA2, respectively named $CG_1$, $CCP_1$ and $CG_2$, $CCP_2$.

The determination of the coefficients of the polynomials also uses as input parameters, aside from those relating to the detector DET and to the frequency band to be rejected, the characteristics of each variable-gain amplifier $PA_1$, $PA_2$ and PA (response times and orders of the transfer function of each variable-gain amplifier $PA_1$, $PA_2$, and PA).

The correspondence table LUT also delivers at its output bias current controls $CCP'_1$, $CCP'_{2a}$, $CCP'_{2b}$ and a gain control $CG'_1$, $CG'_{2a}$, $CG'_{2b}$ for each frequency transposition means $MEL_1$, $MEL_{2a}$, $MEL_{2b}$. However, in certain applications and/or according to the internal architecture of the mixers, delivering the gain controls $CG'_1$, $CG'_{2a}$, $CG'_{2b}$ is optional.

The system 1 also comprises a switch-mode power supply DC/DC and a digital-to-analog converter D/A dedicated to the variable-gain output amplifier PA. The switch-mode power supply DC/DC and the digital-to-analog converter D/A deliver a gain control CG and a bias current control CCP to the variable-gain output amplifier PA using other control information $IC_2$ generated from the setpoint CP without passing through the polynomial digital regulator of the RST type 4.

The control module 3 of the system can be incorporated in software, at least in part, within the base-band process of the telephone. Furthermore, the variation illustrated in FIG. 4 can also be applied to FIG. 6, i.e., the use of two correspondence tables LUT.

That which is claimed is:

1. A method for controlling power of an output signal from an amplifier system comprising at least one variable-gain amplifier receiving an incident signal, the method comprising:

generating filtered digital information based on sampling the output signal from the at least one variable-gain amplifier, the sampled output signal being representative of the power of the output signal;

generating control information based upon a setpoint that is representative of a desired power for the output signal, with the setpoint being different from the sampled output signal from the at least one variable-gain amplifier, and based upon a filter receiving the setpoint and having a transfer function for establishing the power in a desired response time; and establishing as separate inputs a gain control and a bias current control for the at least one variable-gain amplifier based upon the filtered digital information, based upon the control information, and based upon a polynomial digital regulation of the RST type, the polynomial digital regulation of the RST type having polynomial coefficients being determined based upon input parameters comprising characteristics of the at least one variable-gain amplifier and based upon characteristics of a filter generating the filtered digital information.

2. A method according to claim 1, wherein the incident signal comprises a modulated signal having a varying envelope.

3. A method according to claim 1, wherein the at least one variable-gain amplifier comprises a plurality of variable-gain amplifiers including a first variable-gain amplifier and a last variable-gain amplifier; wherein the amplifier system further comprises a variable-gain output amplifier connected to an output of the last variable-gain amplifier; and further comprising establishing a gain control and a bias current control for the variable-gain output amplifier based upon the setpoint and without passing through the polynomial digital regulation of the RST type.

4. A method according to claim 1, wherein the amplifier system comprises at least one frequency transposition mixer, and further comprising establishing a bias current control and a gain control for the at least one frequency transposition mixer.

5. A method according to claim 3, wherein the input parameters comprise response times and orders of transfer functions for each variable-gain amplifier and the variable-gain output amplifier, a time constant of the filter generating the filtered digital information, and a frequency band to be rejected.

6. A method according to claim 1, wherein the gain control and the bias current control for the at least one variable-gain amplifier are further based upon an output signal from the polynomial digital regulation of the RST type and from at least one correspondence table.

7. An amplifier system for controlling power of an output signal therefrom, the amplifier system comprising:
    at least one variable-gain amplifier receiving an incident signal;
    a first generation circuit being configured to sample the output signal from said at least one variable-gain amplifier for generating filtered digital information that is representative of the power of the output signal;
    a filter receiving a setpoint that is representative of a desired power for the output signal, with the setpoint being different from the sampled output signal from said at least one variable-gain amplifier, said filter having a transfer function for establishing the power in a desired response time and generating control information; and
    a control module comprising a polynomial digital regulator of the RST type for establishing as separate inputs a gain control and a bias current control for said at least one variable-gain amplifier based upon the filtered digital information and based upon the control information, said polynomial digital regulator of the RST type having polynomial coefficients being determined based upon input parameters comprising characteristics of said at least one variable-gain amplifier and based upon filtering characteristics of said first generation circuit.

8. An amplifier system according to claim 7, wherein the incident signal comprises a modulated signal having a varying envelope.

9. An amplifier system according to claim 7, wherein said polynomial digital regulator of the RST type comprises a plurality of digital filters each with a finite pulse response, said plurality of digital filters comprising a filter R receiving the filtered digital information, a filter T receiving the control information and a filter 1/S delivering an output signal.

10. An amplifier system according to claim 7, wherein said at least one variable-gain amplifier comprises a plurality of variable-gain amplifiers including a first variable-gain amplifier and a last variable-gain amplifier; and further comprising:
    a variable-gain output amplifier connected at an output of said last variable-gain amplifier; and
    a switch-mode power supply and a digital-to-analog converter for establishing a gain control and a bias current control for said variable-gain output amplifier based upon the setpoint and without passing through said polynomial digital regulator of the RST type.

11. An amplifier system according to claim 7, wherein said first generation circuit comprise:
    a sampling circuit for sampling the output signal;
    a filter connected downstream of said sampling circuit; and
    an analog-to-digital converter connected downstream of said filter and delivering the filtered digital information.

12. An amplifier system according to claim 7, further comprising at least one frequency transposition mixer; and wherein said control module establishes a bias current control and a gain control for said at least one frequency transposition mixer.

13. An amplifier system according to claim 11, wherein the input parameters comprise response times and orders of transfer functions for said at least one variable-gain amplifier, a time constant of said filter generating the filtered digital information, and a frequency band to be rejected.

14. An amplifier system according to claim 7, wherein said control module further comprises at least one correspondence table, and wherein the gain control and the bias current control for said at least one variable-gain amplifier are further based upon an output signal from said polynomial digital regulation of the RST type and from said at least one correspondence table.

15. A cellular mobile telephone comprising:
    a transmission circuit comprising an amplifier system for controlling power of an output signal therefrom, said amplifier system comprising
        at least one variable-gain amplifier receiving an incident signal,
        a first generation circuit being configured to sample the output signal from said at least one variable-gain amplifier for generating filtered digital information that is representative of the power of the output signal,
        a filter receiving a setpoint that is representative of a desired power for the output signal, with the setpoint being different from the sampled output signal from said at least one variable-gain amplifier, said filter having a transfer function for establishing the power in a desired response time and generating control information, and
        a control module comprising a polynomial digital regulator of the RST type for establishing as separate inputs a gain control and a bias current control for said at least one variable-gain amplifier based upon the filtered digital information and based upon the control information, said polynomial digital regulator of the RST type having polynomial coefficients being determined based upon input parameters comprising characteristics of said at least one variable-gain amplifier and based upon filtering characteristics of said first generation circuit.

16. A cellular mobile telephone according to claim 15, wherein the incident signal comprises a modulated signal having a varying envelope.

17. A cellular mobile telephone according to claim 15, wherein said polynomial digital regulator of the RST type comprises a plurality of digital filters each with a finite pulse response, said plurality of digital filters comprising a filter R receiving the filtered digital information, a filter T receiving the control information and a filter 1/S delivering an output signal.

18. A cellular mobile telephone according to claim 15, wherein said at least one variable-gain amplifier comprises a plurality of variable-gain amplifiers including a first variable-gain amplifier and a last variable-gain amplifier; said amplifier system further comprising:
    a variable-gain output amplifier connected at an output of said last variable-gain amplifier; and
    a switch-mode power supply and a digital-to-analog converter for establishing a gain control and a bias current control for said variable-gain output amplifier based upon the setpoint and without passing through said polynomial digital regulator of the RST type.

19. A cellular mobile telephone according to claim 15, wherein said first generation circuit comprise:

a sampling circuit for sampling the output signal;

a filter connected downstream of said sampling circuit; and an analog-to-digital converter connected downstream of said filter and delivering the filtered digital information.

20. A cellular mobile telephone according to claim 15, wherein said amplifier system further comprises at least one frequency transposition mixer; and wherein said control module establishes a bias current control and a gain control for said at least one frequency transposition mixer.

21. A cellular mobile telephone according to claim 19, wherein the input parameters comprise response times and orders of transfer functions for said at least one variable-gain amplifier, a time constant of said filter generating the filtered digital information, and a frequency band to be rejected.

22. A cellular mobile telephone according to claim 15, wherein said control module further comprises at least one correspondence table, and wherein the gain control and the bias current control for said at least one variable-gain amplifier are further based upon an output signal from said polynomial digital regulation of the RST type and front said at least one correspondence table.

* * * * *

UNITED STATES PATENT AND TRADEMARK OFFICE
CERTIFICATE OF CORRECTION

PATENT NO. : 7,586,996 B2　　　　　　　　　　　　　　　　　　　　　　　Page 1 of 1
APPLICATION NO. : 11/088616
DATED : September 8, 2009
INVENTOR(S) : Patrick Cerisier and Patrice Musy It is certified that error appears in the above-identified patent and that said Letters Patent is hereby corrected as shown below:

| | |
|---|---|
| Cover page, Line 1<br>Other Publications | Delete: "Trasnform"<br>Insert: --Transform-- |
| Column 7, Line 61<br>Claim 11 | Delete: "comprise:"<br>Insert: --comprises:-- |
| Column 8, Line 67<br>Claim 19 | Delete: "comprise:"<br>Insert: --comprises:-- |

Signed and Sealed this

First Day of June, 2010

David J. Kappos
*Director of the United States Patent and Trademark Office*

UNITED STATES PATENT AND TRADEMARK OFFICE
CERTIFICATE OF CORRECTION

PATENT NO. : 7,586,996 B2  Page 1 of 1
APPLICATION NO. : 11/088616
DATED : September 8, 2009
INVENTOR(S) : Cerisier et al.

It is certified that error appears in the above-identified patent and that said Letters Patent is hereby corrected as shown below:

Title page, item (*) Notice: Subject to any disclaimer, the term of this patent is extended or adjusted under 35 U.S.C. 154(b) by 708 days.

Delete "708 days" and insert --1203 days--.

Signed and Sealed this

Twenty-seventh Day of July, 2010

David J. Kappos
*Director of the United States Patent and Trademark Office*